US007020830B2

(12) United States Patent
D'Arcy et al.

(10) Patent No.: US 7,020,830 B2
(45) Date of Patent: Mar. 28, 2006

(54) HIGH SPEED ADD-COMPARE-SELECT OPERATIONS FOR USE IN VITERBI DECODERS

(75) Inventors: Paul Gerard D'Arcy, Chelmsford, MA (US); Rajan V. K. Pillai, Atlanta, GA (US)

(73) Assignee: Agere Systems Inc., Allentown, PA (US)

( * ) Notice: Subject to any disclaimer, the term of this patent is extended or adjusted under 35 U.S.C. 154(b) by 401 days.

(21) Appl. No.: 10/028,453

(22) Filed: Dec. 24, 2001

(65) Prior Publication Data

US 2003/0120996 A1 Jun. 26, 2003

(51) Int. Cl.
*H03M 13/03* (2006.01)

(52) U.S. Cl. ....................... 714/795; 714/794; 708/671

(58) Field of Classification Search ................ 714/794, 714/795; 375/341; 708/671
See application file for complete search history.

(56) References Cited

U.S. PATENT DOCUMENTS

| | | | | |
|---|---|---|---|---|
| 5,327,440 | A * | 7/1994 | Fredrickson et al. | 714/795 |
| 5,490,178 | A | 2/1996 | Blaker et al. | |
| 5,533,065 | A | 7/1996 | Blaker et al. | |
| 5,537,445 | A | 7/1996 | Blaker et al. | |
| 5,559,837 | A | 9/1996 | Blaker et al. | |
| 6,148,431 | A * | 11/2000 | Lee et al. | 714/794 |
| 6,298,464 | B1 * | 10/2001 | Tong et al. | 714/795 |
| 6,330,684 | B1 * | 12/2001 | Yamanaka et al. | 714/1 |
| 6,373,906 | B1 * | 4/2002 | Cideciyan et al. | 375/341 |

OTHER PUBLICATIONS

A. Weinberger, "4:2 Carry Save Adder Module," IBM Technical Disclosure Bulletin, vol. 23, pp. 3811-3814, Jan. 1981.

G. Fettweis et al., "High-Rate Viterbi Processor: A Systolic Array Solution," IEEE Journal of Selected Areas in Communication, vol. 8, pp. 1520-1534, Oct. 1990.

* cited by examiner

*Primary Examiner*—Joseph Torres

(57) ABSTRACT

Techniques are provided for the addition and comparison operations associated with a Viterbi decoding algorithm at substantially the same time. To this end, an operation of the type a±b>c±d (where a and b are to be added, c and d are to be added, and then the sums compared to determine the larger of the two sums) can be formulated, in accordance with the invention, into a±b−c∓d>0 (where the addition of a and b and of c and d, and their comparison, are substantially concurrently performed). More specifically, in order to facilitate substantially concurrent addition and comparison operations in a Viterbi decoder, in one embodiment, the present invention performs multi-operand addition in a carry save form. With the results of addition represented in carry save form, the evaluation of comparator conditions is relatively straightforward.

16 Claims, 8 Drawing Sheets

*FIG. 3*

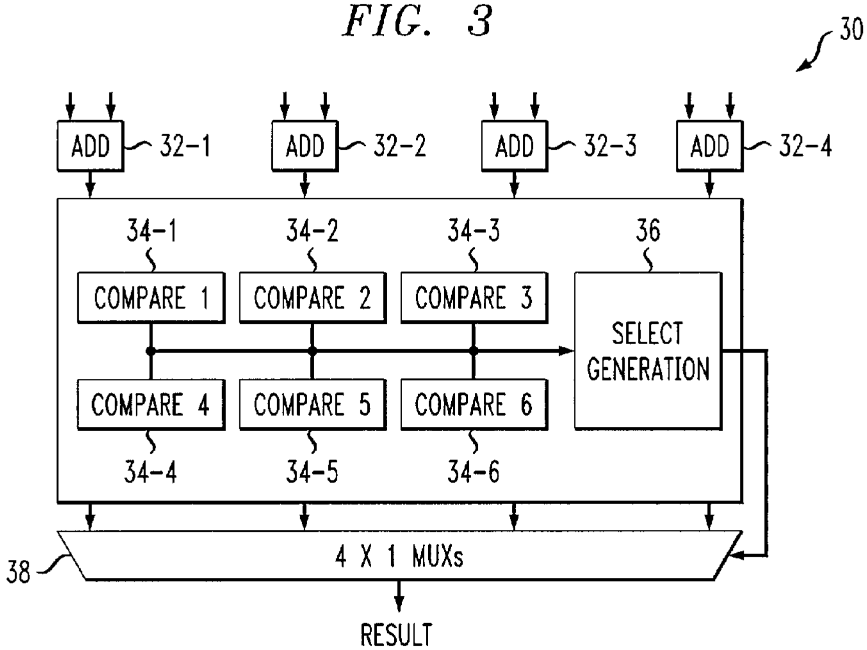

*FIG. 4A*

| | | | | | | | | | |
|---|---|---|---|---|---|---|---|---|---|
| 0 | a7 | a6 | a5 | a4 | a3 | a2 | a1 | a0 | ← a |
| 0 | b7 | b6 | b5 | b4 | b3 | b2 | b1 | b0 | ← b |
| 1 | $\overline{c7}$ | $\overline{c6}$ | $\overline{c5}$ | $\overline{c4}$ | $\overline{c3}$ | $\overline{c2}$ | $\overline{c1}$ | $\overline{c0}$ | ← $\overline{c}$ |
| 1 | $\overline{d7}$ | $\overline{d6}$ | $\overline{d5}$ | $\overline{d4}$ | $\overline{d3}$ | $\overline{d2}$ | $\overline{d1}$ | $\overline{d0}$ | ← $\overline{d}$ |
| | | | | | | | | 1 | ← CORRECTION BIT |

*FIG. 4B*

| Cout(0) | Cout(1) | REMARKS |
|---|---|---|
| 0 | 0 | $p < q$ |
| 0 | 1 | $p = q \rightarrow p - q = 0$ |
| 1 | 0 | IMPOSSIBLE |
| 1 | 1 | $p > q$ |

*FIG. 4F*

| | | | | | | | | | |
|---|---|---|---|---|---|---|---|---|---|
| INPUT a | | 1 | 1 | 0 | 0 | 0 | 1 | 1 | 0 |
| INPUT b | | 0 | 0 | 1 | 1 | 1 | 0 | 0 | 1 |
| INPUT c | | 1 | 1 | 1 | 1 | 0 | 0 | 0 | 0 |
| INPUT d | | 0 | 0 | 0 | 0 | 1 | 0 | 0 | 0 |
| THE NEXT 4 ROWS REPRESENT THE INPUTS OF 4:2 COMPRESSION LOGIC, ANALOGOUS TO THAT REPRESENTED BY FIGURE 4A | | | | | | | | | |
| INPUT a | 0 | 1 | 1 | 0 | 0 | 0 | 1 | 1 | 0 |
| INPUT b | 0 | 0 | 0 | 1 | 1 | 1 | 0 | 0 | 1 |
| INPUT $\bar{c}$ | 1 | 0 | 0 | 0 | 0 | 1 | 1 | 1 | 1 |
| INPUT $\bar{d}$ | 1 | 1 | 1 | 1 | 1 | 0 | 1 | 1 | 1 |
| CORRECTION BIT | | | | | | | | | 1 |
| t' BITS (SHADED BITS ARE INTERNAL TO THE NETWORK OF 4:2 COMPRESSORS, THE UNSHADED BIT IS t7') | 0 | 0 | 0 | 0 | 1 | 1 | 1 | 1 | 1 |
| s BITS | | 0 | 0 | 0 | 1 | 1 | 0 | 0 | 0 |
| t BITS | 1 | 1 | 1 | 1 | 0 | 1 | 1 | 1 | |
| OUTPUT OF 4:2 COMPRESSION NETWORK; s, t BIT VECTORS: CARRY OUTPUT FROM THE MSB INDICATES THE RELATIVE MAGNITUDES OF a + b AND c + d. IN THIS CASE, Cout = 1 WHICH IMPLIES a + b > c + d | 0 | 0 | 0 | 0 | 1 | 1 | 0 | 0 | ϕ |
| | 1 | 1 | 1 | 1 | 0 | 1 | 1 | 1 | |

*FIG. 4G*

| | | | | | | | | | |
|---|---|---|---|---|---|---|---|---|---|
| INPUT a | | 1 | 1 | 0 | 0 | 0 | 1 | 1 | 0 |
| INPUT b | | 0 | 0 | 1 | 1 | 1 | 0 | 0 | 1 |
| INPUT c | | 1 | 1 | 1 | 1 | 0 | 0 | 0 | 0 |
| INPUT d | | 0 | 0 | 0 | 0 | 1 | 1 | 1 | 1 |
| THE NEXT 4 ROWS REPRESENT THE INPUTS OF 4:2 COMPRESSION LOGIC, ANALOGOUS TO THAT REPRESENTED BY FIGURE 4A | | | | | | | | | |
| INPUT a | 0 | 1 | 1 | 0 | 0 | 0 | 1 | 1 | 0 |
| INPUT b | 0 | 0 | 0 | 1 | 1 | 1 | 0 | 0 | 1 |
| INPUT $\bar{c}$ | 1 | 0 | 0 | 0 | 0 | 1 | 1 | 1 | 1 |
| INPUT $\bar{d}$ | 1 | 1 | 1 | 1 | 1 | 0 | 0 | 0 | 0 |
| CORRECTION BIT | | | | | | | | | 1 |
| t' BITS (SHADED BITS ARE INTERNAL TO THE NETWORK OF 4:2 COMPRESSORS, THE UNSHADED BIT IS t7') | 0 | 0 | 0 | 0 | 1 | 1 | 1 | 1 | 1 |
| s BITS | | 0 | 0 | 0 | 1 | 1 | 1 | 1 | 1 |
| t BITS | 1 | 1 | 1 | 1 | 0 | 0 | 0 | 0 | |
| OUTPUT OF 4:2 COMPRESSION NETWORK; s, t BIT VECTORS: CARRY OUTPUT FROM THE MSB INDICATES THE RELATIVE MAGNITUDES OF a + b AND c + d. IN THIS CASE, Cout = 0 WHICH IMPLIES $a + b \leq c + d$ (CONDITIONAL CARRIES Cout(0) = 0 AND Cout(1) = 1 IN THIS CASE) | 0 | 0 | 0 | 0 | 1 | 1 | 1 | 1 | ϕ |
| | 1 | 1 | 1 | 1 | 0 | 0 | 0 | 0 | |

HIGH SPEED ADD-COMPARE-SELECT OPERATIONS FOR USE IN VITERBI DECODERS

FIELD OF THE INVENTION

The present invention generally relates to Viterbi decoders and, more particularly, to techniques for improving the performance of add-compare-select operations performed by Viterbi decoders.

BACKGROUND OF THE INVENTION

A Viterbi decoder is a maximum likelihood decoder that provides forward error correction. Viterbi decoders are used to decode a sequence of encoded symbols, such as a bit stream. The bit stream can represent encoded information in a telecommunication system. Such information can be transmitted through various media with each bit (or set of bits) representing a symbol instant. In the decoding process, the Viterbi decoder works back through a sequence of possible bit sequences at each symbol instant to determine which one bit sequence is most likely to have been transmitted. The possible transitions from a bit at one symbol instant, or state, to a bit at a next, subsequent, symbol instant or state is limited. Each possible transition from one state to a next state can be shown graphically and is defined as a branch. A sequence of interconnected branches is defined as a path. Each state can transition only to a limited number of next states upon receipt of the next bit in the bit stream. Thus, some paths survive and other paths do not survive during the decoding process. By eliminating those transitions that are not permissible, computational efficiency can be increased in determining the most likely paths to survive. The Viterbi decoder typically defines and calculates a branch metric associated with each branch and employs this branch metric to determine which paths survive and which paths do not survive.

A branch metric is calculated at each symbol instant for each possible branch. Each path has an associated metric, accumulated cost, that is updated at each symbol instant. For each possible transition, the path metric (i.e., accumulated cost) for the next state is calculated.

In a Viterbi decoder, the add-compare-select (ACS) module handles the addition of operands to evaluate different path metrics and the selection of one of the path metrics in accordance with the relative magnitudes of these metrics. More particularly, a path metric computation involves the addition of a branch metric with a previous value of a path metric. In this portion of the computation, multiple potential path metrics are calculated. For example, in 2-way ACS (also referred to as radix 2 ACS), values of two potential path metrics are calculated. A path metric computation also involves the selection of one path metric from two or more potential path metrics in accordance with their relative magnitudes. For example, in 2-way ACS, two potential path metrics are evaluated and the larger one is selected. In sum, ACS operations produce a result that is a path metric. The inputs to this operation are previously computed path metrics and relevant branch metrics.

However, as is known, existing ACS algorithms are sequential in nature. That is, the comparison of potential path metrics typically relies on the substantial completion of the add operations which generate those potential path metrics. Such a sequential arrangement disadvantageously impacts the speed performance of the overall ACS operation.

Thus, in Viterbi decoders, there is a need for techniques which improve the performance of ACS operations by overcoming the drawbacks inherent in the sequential handling of addition and comparison operations associated with conventional ACS schemes.

SUMMARY OF THE INVENTION

The present invention provides substantially concurrent add-compare techniques for use in the add-compare-select (ACS) operations of a Viterbi decoder. As will be explained and illustrated in detail below, such techniques perform addition and comparison operations associated with a Viterbi decoder substantially simultaneously.

In one aspect of the invention, a technique for performing add-compare-select operations in accordance with a Viterbi decoder comprises the following steps. Input values of two or more sets of input values are respectively added to generate sums for the two or more sets. Substantially concurrent with the respective addition of the input values of the two or more sets of input values, the two or more sets of input values are compared. Then, one of the generated sums of the two or more input sets is selected based on the comparison of the two or more sets of input values. Preferably, in the comparison operation, the two or more sets of input values are compared to make a determination as to which set of the two or more sets would result in the largest sum.

In one illustrative embodiment, the comparison operation may be performed as follows. First, carry save addition (targeting subtraction of the sum of one set of input values from the sum of another set of input values) is performed on the two sets of input values. Then, the carry output from the most significant bit end of the sum of the results of the above operation is evaluated. This carry indicates whether the subtracted quantity (which is the sum of the respective inputs) is less than the other. The carry save addition operation may be performed by one or more data compression stages, e.g., in a radix 2 ACS module, this may include one level (or more levels if the input data is represented in carry save form) of a 4:2 compression network.

More particularly, in the context of the Viterbi decoder, one input value of each set of input values is a previously computed path metric and the other input value of each set of input values is an appropriate branch metric. In this manner, the generated sum of the input values represents a new path metric which may potentially be selected based on the substantially concurrent comparison operation.

Advantageously, in accordance with the present invention, the comparison result may be available almost simultaneous with the availability of two or more sums (each of these sums are generated through the addition of an appropriate set of input metrics). However, it should be understood that even if the sums are available before the resolution of the comparison, there is no real use for these sums until the comparison is completed. This gives a designer an added degree of design freedom in that adders utilized in the design can be simplified. However, with conventional approaches, the adder spans through the critical path of the add-compare-select operation. In other words, in a conventional approach, it is binding that additions are completed before comparison. Any simplifications that slow down the adders slow down the entire add-compare-select operation. Hence, the extra degree of freedom in design afforded by the present invention, i.e., adder simplifications targeting power and area reduction without compromising the speed of the ACS operation, is not available with conventional approaches.

By way of one example only, in radix 2 and 4 ACS modules involving 16 bit operands, the ACS techniques of the present invention offer a worst case delay reduction of better than 10% for sub 0.2 micron CMOS (complementary metal oxide semiconductor) processes.

These and other objects, features and advantages of the present invention will become apparent from the following detailed description of illustrative embodiments thereof, which is to be read in connection with the accompanying drawings.

BRIEF DESCRIPTION OF THE DRAWINGS

FIG. 3 is a block diagram illustrating an ACS module which employs concurrent comparison;

FIGS. 4A through 4C are tables illustrating techniques of multi-operand add-compare according to an embodiment of the present invention;

FIGS. 4F and 4G are tables illustrating examples of carry save addition based comparison according to an embodiment of the present invention;

DETAILED DESCRIPTION OF PREFERRED EMBODIMENTS

In the present application, the addition-related phrases "carry propagate" form (or representation) and "carry save" form (or representation) are frequently used. While the terms are not necessarily intended to be so limited, general preferred definitions of the phrases are given below in order to provide a better understanding of the detailed descriptions provided herein.

Carry propagate addition: In binary addition, the carries from lower order bit positions (if they exist) propagate towards higher order bit positions, through intermediate bit positions that do not kill carries. This type of addition is referred to as carry propagate addition. The result is a binary number.

Carry save addition: This is an approach used for the evaluation of multi-operand addition. A prime example is partial product summation in multipliers. In carry save addition, the time consuming carry propagations are not performed. Rather, the carries generated at various bit positions are saved as another binary number. For example, in a three operand addition involving a single level of full adders, two outputs from the full adder network, i.e., sum and carry, together represent the result. In order to form the final result as a single binary number, these binary numbers (sum and carry) should be added together (carry propagate addition). In contrast to carry propagate addition, carry save addition always produces results in sum and carry form, wherein each of the sum and carry are binary numbers themselves.

For a further explanation of such binary addition-based representations, one may refer to K. K. Parhi, "VLSI Digital Signal Processing Systems—Design and Implementation," Wiley-Interscience, John Wiley and Sons, Inc. 1999, the disclosure of which is incorporated by reference herein.

Figure 1:
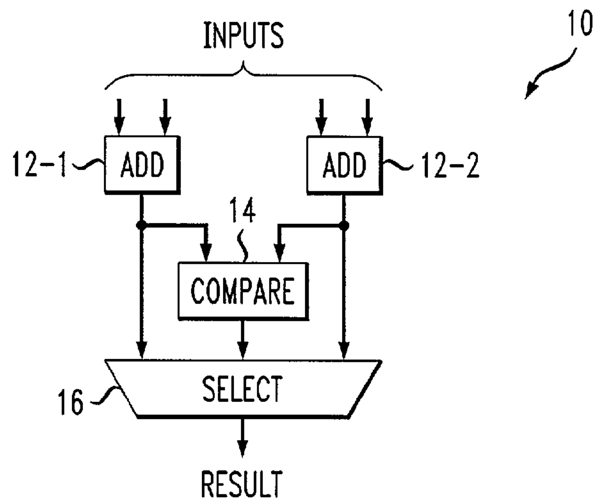
FIG. 1 is a block diagram illustrating a 2-way ACS module.

Referring initially to FIG. 1, a block diagram illustrates one of the most widely employed 2-way ACS schemes. In this scheme, the path metrics are first computed and then compared against one another such that the larger of the two is selected. More specifically, as illustrated in FIG. 1, the ACS module 10 comprises two add blocks 12-1 and 12-2, a compare block 14, and a select block 16. Each add block computes a path metric from its inputs. As previously explained, the inputs to each add block are a previously computed path metric and an appropriate branch metric. Then, the compare block receives the respective metrics and compares them against one another. The compare block then instructs the select block to output the larger of the two as the ACS result.

Figure 2:
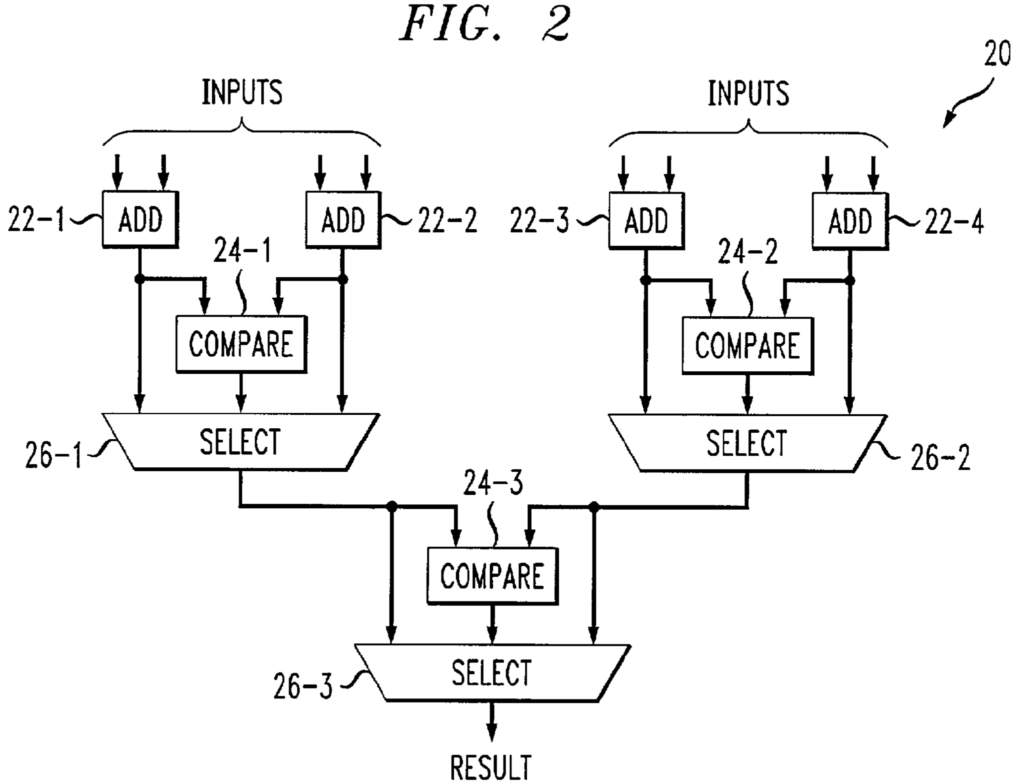
FIG. 2 is a block diagram illustrating a 4-way ACS module.

FIG. 2 illustrates a straightforward extension of this scheme for the realization of 4-way ACS (also referred to as radix 4 ACS). As illustrated in FIG. 2, the ACS module 20 comprises four add blocks 22-1 through 22-4, three compare blocks 24-1 through 24-3, and three select blocks 26-1 through 26-3. In this arrangement, add blocks 22-1 and 22-2 respectively compute path metrics from their inputs. Again, the inputs to each add block are a previously computed path metric and an appropriate branch metric. Then, the compare block 24-1 receives the path metrics and compares them against one another. The compare block then instructs the select block 26-1 to output the larger of the two metrics as an ACS sub-result. Likewise, in parallel, add blocks 22-3 and 22-4 respectively compute path metrics from their inputs. Then, the compare block 24-2 receives the metrics and compares them against one another. The compare block then instructs the select block 26-2 to output the larger of the two metrics as an ACS sub-result. Next, in compare block 24-3, the sub-results are compared against one another. Lastly, the compare block 24-3 instructs the select block 26-3 to output the larger of the two sub-results as an ACS result. The 4-way ACS scheme shown in FIG. 2 is not widely used in hardware implementations owing to its poor speed performance.

FIG. 3 illustrates another ACS scheme that is, however, widely used. In this scheme, the compare blocks perform concurrent comparison of all possible combinations of path metrics. The outputs of these comparators are integrated together to form the selection signal. As illustrated in FIG. 3, the ACS module 30 comprises four add blocks 32-1 through 32-4, six compare blocks 34-1 through 34-6, a select generation block 36, and a 4×1 multiplexer (MUX) 38. Each add block 32-1 through 32-4 generates a metric from its inputs. Then, the compare blocks 34-1 through 34-6 perform concurrent comparison of all combinations of the path metrics pairs (outputs of any two adders form a pair). Select generator 36 integrates the outputs of the comparators to form the appropriate selection signal, i.e., the signal that indicates which of the generated path metrics is largest. The MUX 38 then outputs the largest path metric in response to the selection signal. As is evident, this scheme is typically faster compared to the scheme presented in FIG. 2.

Thus, as is evident, the above ACS algorithms are sequential in nature. In hardware implementations, speed performance enhancements of ACS operations has been achieved by performing the comparison operation as a subtraction. In adders, since the least significant bits (LSBs) of the sum appear earlier, comparison can start as soon as these bits are available. The add and compare carries propagate from the LSB to the most significant bit (MSB) relatively quickly. Once the addition is complete, the compare result is also available within a few gate delays. With this approach, fast ACS operations require fast addition and fast comparison. However, full parallel implementation of ACS schemes using the above approach is limited by the fanouts of logic signals. Systolic/bit serial implementations that envision comparisons starting from the MSB end are also described in G. Fettweis et al., "High-Rate Viterbi Processor: A Systolic Array Solution," IEEE Journal of Selected Areas in Communication, vol. 8, pp. 1520–1534, October 1990, the disclosure of which is incorporated by reference herein.

With higher radix ACS units using the approach of FIG. 3, the inherent sequential nature of the algorithm is relieved, to an extent. With this approach, as is evident from FIG. 3, multiple comparators work in parallel thus allowing such an approach to offer higher throughput than lower radix units. However, with a higher radix ACS unit, the complexity and hence the silicon area associated with its circuit representation are higher. For example, with an 8-way ACS, twenty eight comparators are required.

As is evident from the above description, the speed performance of ACS operations in Viterbi decoders suffers mainly due to the sequential handling of addition and comparison operations. The present invention realizes that both the addition and comparison operations associated with a Viterbi decoding algorithm can be substantially concurrently performed. To this end, an operation of the type $a \pm b > c \pm d$ (where a and b are to be added, c and d are to be added, and then the sums compared to determine the larger of the two sums) can be formulated, in accordance with the invention, into $a \pm b - c \mp d > 0$ (where the addition of a and b and of c and d, and their comparison, are substantially concurrently performed). More specifically, in order to facilitate substantially concurrent addition and comparison operations in a Viterbi decoder, in one embodiment, the present invention performs multi-operand addition in a carry save form. With the results of addition represented in carry save form, the evaluation of comparator conditions is rather straightforward, as will be illustrated in detail below.

Figure 4C:
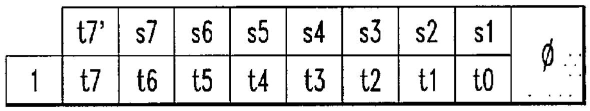
Figure 4D:
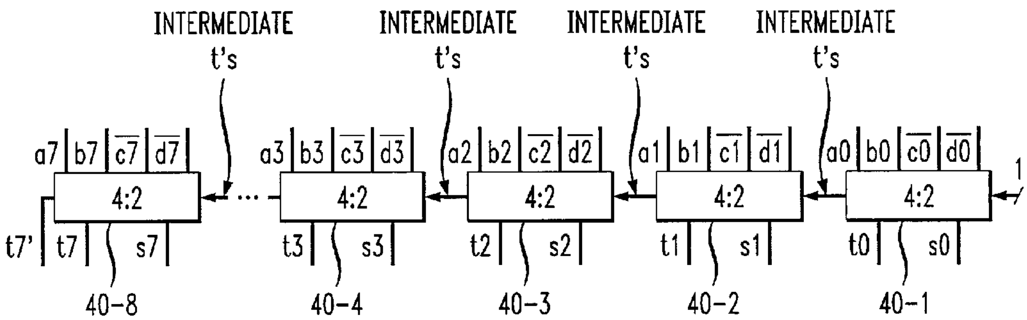
FIG. 4D is a block diagram illustrating an organization of 4:2 compressors for carry save addition according to an embodiment of the present invention.
Figure 4E:
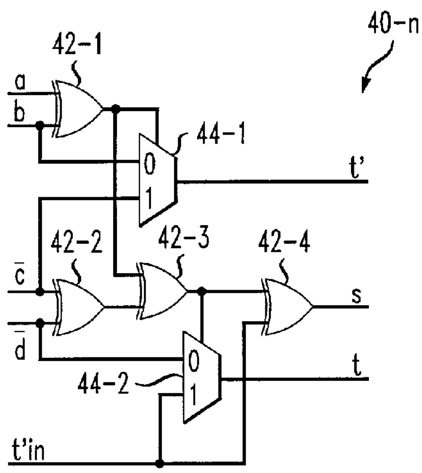
FIG. 4E is a schematic diagram illustrating a 4:2 compressor that may be employed in accordance with an embodiment of the present invention.

As will be evident from the illustrative embodiments described below, the add and compare operations of the present invention are performed substantially concurrent with one another. First, the add operations start as soon as the inputs are available. As explained above, inputs comprise appropriate path and branch metrics. Comparison operations do not start immediately upon availability of the inputs, but rather start after a certain degree of pre-processing is performed. Such pre-processing involves the evaluation of a set of two outputs from four inputs, referred to as 4:2 compression. As will be explained below, the inputs before this compression appear in the form represented in FIG. 4A, while FIG. 4C represents the outputs of these 4:2 compressors. FIG. 4D illustrates the organization of a carry save adder network (with multiple 4:2 compressors) that processes the signals illustrated in FIG. 4A and produces the results illustrated in FIG. 4C. FIG. 4E illustrates an exemplary logical representation of one of the 4:2 compressors.

In general, the generation of a select signal follows the comparison. The select signal appears after the completion of addition. However, in contrast to the timing of the appearance of the select signal in the above-described sequential add-compare scheme, a select signal appears appreciably earlier in the overall ACS operation of the present invention. It is to be understood that the actual timing relationship is decided by the particular implementation. Accordingly, in a preferred embodiment, with state-of-the-art circuit techniques being used to implement the present invention, the addition and comparison operations can be completed in almost complete concurrence.

FIGS. 4A and 4B illustrate the techniques of multi-operand add-compare according to an embodiment of the present invention. Specifically, FIG. 4A illustrates the data representation for 1's complement addition of the type $a+b+\overline{(c+d)}$ involving 8 bit unsigned data a, b, c and d, where $\overline{(c+d)}$ represents the 1's complement of (c+d). As is known in binary number representation, a first binary number can be subtracted from a second binary number by converting the first binary number to a 1's complement representation and then adding the 1's complement representation of the first binary number to the second binary number. In 1's complement representation, the 1's complement of a binary number is formed by changing each 1 in the number to a 0 and each 0 in the number to a 1. When 1's complement addition is performed, any end around carry is added to the LSB (least significant bit) of the number generated.

It is to be understood that the '1' shown at the least significant bit position (a0, b0, etc.) in FIG. 4A is a correction bit, not the end around carry. In binary arithmetic, the 1's complement of (a+b) denoted by $\overline{(a+b)}$ equals $\overline{(a)}+\overline{(b)}+1$. Addition of this '1' is a correction step. It is this It is this '1' that appears at the LSB of FIG. 4A. A generalization of this can be stated as follows: the 1's complement of the sum of n numbers is, by definition, equal to the sum of the 1's complements of these numbers plus (n−1).

Further, the end around carry in 1's complement addition also reveals the relative magnitudes of input operands. During an operation of the type $p+\overline{q}$ involving unsigned integer data p and q, an end around carry of 1 indicates that the result is positive, which implies $p>q$. With 1's complement conditional sum addition, the carry outputs contain yet a higher level of information regarding the relative magnitudes of the input operands. FIG. 4B presents an analysis. As shown in FIG. 4B, Cout(0) and Cout(1) represent the conditional carry outputs from the MSB end of an adder anticipating input carries of 0 and 1, respectively. Incidentally, it may be observed that the conditional carry output Cout(1) represents the carry output from the MSB end of a 2's complement adder that performs the operation $p-q$. As is known, in 2's complement, a binary number is formed by changing each 1 in the number to a 0 and each 0 in the number to a 1, and then adding 1 to the LSB of the number generated. It may be further observed that since $p>q$ and $p<q$ are mutually exclusive conditions, an evaluation of the third condition $p=q$ is virtually free, i.e., $p=q$ condition is true if and only if neither $p>q$ nor $p<q$.

It is to be understood that the 1's in the leftmost column of FIG. 4A represent sign bits, which indicate that the number represented by the particular row of bits is negative. We already know that these are 1's complement numbers. With reference to FIGS. 4A and 4C, the t7, t7' bit position occurs on the left side of the a7, b7, $\overline{c7}$, $\overline{d7}$ bit position.

Further, it is to be understood that the symbol φ in FIG. 4C represents don't care, a typical terminology followed by logic designers. The bit indicated don't care remains don't care as far as the evaluation of a single comparator condition (here, p>q and its complement p≦q) is concerned. However, if a third condition p=q is to be inferred, then the assertion of this bit also has to be taken into account. In other words, to generate the signal Cout(1) of FIG. 4B, we have to take into account the bit marked don't care. However, for the evaluation of Cout(0), this is not required. In Viterbi decoders, we are only interested to see whether one of the potential candidate metrics is greater than or equal to its peers. Hence, we can conveniently ignore the bit marked don't care so that the carry evaluation circuits are simpler.

In accordance with the present invention and as will be explained in more detail below, the data represented in FIG. 4A can be compressed together using a single level of 4:2 compressors. Such an organization is shown in FIG. 4D with a single level of eight compressors (denoted as 40-1 through 40-8, with 40-5 through 40-7 not shown for the sake of simplicity). For example, well-known 4:2 compressors of the type described in A. Weinberger, "4:2 Carry Save Adder Module," IBM Technical Disclosure Bulletin, 23, 1981, the disclosure of which is incorporated by reference herein, may be employed. The compressed outputs are represented in FIG. 4C where the ss and the ts represent the compressed sum and carry bits, respectively.

An illustration of a 4:2 compressor is shown in FIG. 4E. More specifically, FIG. 4E illustrates one of the multiplexor-based 4:2 compressors 40-*n* shown in FIG. 4D (i.e., 40-1 through 40-8, where n=1, . . . , 8). Each compressor in the level is preferably identical. As is well-known and evident from the logic arrangement of FIG. 4E, exclusive OR gates 42-1 through 42-4, and multiplexers 44-1 and 44-2 are capable of processing a portion of the inputs from FIG. 4A to result in a portion of the output shown in FIG. 4C. For example, compressor 40-1 inputs a0, b0, $\overline{c0}$, and $\overline{d0}$ and yields sum bit s0 and carry bit t0, as well as intermediate carry bit t0'. In compressor 40-1, $t'_{in}$ is set to 1. Recall in FIG. 4A that there appears a correction bit of 1. Setting $t'_{in}$ of the 4:2 compressor at this bit position to a 1 serves to incorporate the correction operation. In logic implementation, the injection of this 1 helps logic simplification and, hence, a simplified 4:2 compressor may be used at this position.

Bits s0, t0 and t0' are generated by compressor 40-1 from bits a0, b0, $\overline{c0}$, and $\overline{d0}$ in accordance with the logic model illustrated in FIG. 4E. Then, compressor 40-2 inputs a1, b1, $\overline{c1}$, $\overline{d1}$, and t0' and yields sum bit s1 and carry bit t1, as well as intermediate carry bit t1'. Since each of the compressors in FIG. 4D are identical to that shown in FIG. 4E, generation of the sum bit, carry bit and intermediate carry bit for the other inputs (a2, b2, $\overline{c2}$, $\overline{d2}$ through a7, b7, $\overline{c7}$, $\overline{d7}$) occur as explained above. One of ordinary skill in the art will realize the operations of the well-known 4:2 compressor illustrated in FIG. 4E, particularly in view of the examples to be given below in FIGS. 4F and 4G. Thus, the eight 4:2 compressors 40-1 through 40-8 are able to compress the inputs shown in FIG. 4A into the representation shown in FIG. 4C.

With the compressed outputs, evaluation of a±b>c±d involves the computation of a carry output from the t7, t7' bit position. As explained above, a carry out of 1 implies a±b>c±d and a carry out of 0 implies the complementary condition, i.e., a±b≦c±d.

In carry propagate addition, there are three mutually exclusive carry conditions at each bit position. These are: generate, propagate or kill. Generate implies the generation of a carry. Propagate implies no carry generation, but in case a carry from a lower order bit position is injected at a particular bit position, it gets propagated to the next higher order bit position. Carry kill implies that if a carry is injected at a bit position, it never propagates beyond that position. In carry propagate adders, the above carry conditions at each bit position are evaluated. Now, a "carry chain network" combines the impact of these conditions starting from the least significant bit position towards the most significant bit position. This network spans the entire width of an adder. With the above approach, one can also define carry properties like; group generate, group propagate and group kill. For example, if we define these conditions on a 16 bit adder, the group generate signal (of this 16 bit group) reveals whether this 16 bit group will produce a carry output. The group propagate and kill conditions respectively indicate the other carry conditions.

The computation of a carry output from the t7, t7' bit position involves the evaluation of a group carry generate signal. The carry network, in this case, spans from the t0, s1 bit position to the t7, t7' bit position.

Referring now to FIGS. 4F and 4G, tabular examples of a comparison operation based on carry save addition, according to an embodiment of the present invention, are provided. More specifically, the table in FIG. 4F represents a case where a+b>c+d, while the table in FIG. 4G represents a case where a+b≦c+d. That is, the tables in FIGS. 4F and 4G respectively illustrate two specific examples of how the carry save addition operation described in conjunction with FIGS. 4A through 4D operates. Given the explanations above in the context of FIGS. 4D and 4E with respect to how a single level of 4:2 compressors may operate, the examples shown in FIGS. 4F and 4G (with the comments provided therein) are self-explanatory and one skilled in the art will realize how the value of each bit is computed.

The idea of performing comparison without performing carry propagate addition, as described above, can be generalized as follows. Operations of the type:

$$\sum_{i=0}^{k} p_i > \sum_{j=0}^{l} q_j \qquad (1)$$

involving integer/2 's complement/fixed point data $p_i$, $q_j$ can be easily handled by the above-described technique. Also, there is no limitation that the comparison operation need be restricted to strict inequality, rather >, ≧, =, <, ≦ or any combination of these conditions can be handled. It is to be understood that, in all these cases, appropriate transformations on data are warranted so that the compress-carry evaluate operation always produces the end around carry of a 1's complement adder, i.e., Cout(0) (plus Cout(1), if desired).

Extending this approach a step further, and realizing that even multiplication can be considered a multi-operand problem, concurrent comparison of multiply-add results may also be performed in accordance with the present invention.

By employing the above-described compression and carry techniques, the comparison operation can begin as soon as the input data a, b, c and d is available. Advantageously, unlike the sequential approach, there is no need to wait for the completion of a+b and/or c+d. In general, it is known that the fastest carry propagate adders deliver results in logarithmic time. This is also known to be true with respect to comparators as well. Thus, with the above-described techniques, the carry save addition/compression of input operands is handled in constant time, irrespective of the data size. Because of this, the time complexity of the ACS techniques of the invention is less than that of the conventional ACS techniques.

Figure 5:
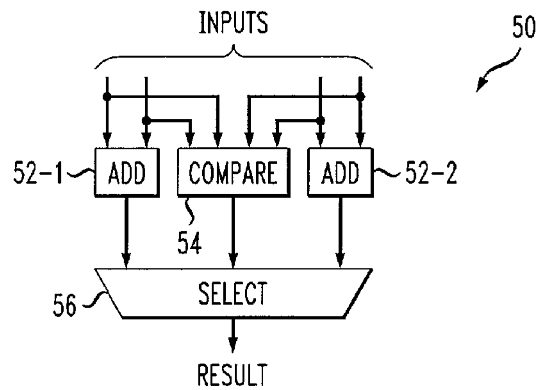
FIG. 5 is a block diagram generally illustrating a 2-way ACS module according to an embodiment of the present invention.

FIG. 5 is a block diagram generally illustrating a 2-way ACS module according to an embodiment of the present invention. As illustrated in FIG. 5, the ACS module 50 comprises two add blocks 52-1 and 52-2, a compare block 54, and a select block 56. As is evident, in comparison to the 2-way ACS module illustrated and described above in the context of FIG. 1, the inputs to the inventive ACS module of FIG. 5 are provided to both the add blocks 52-1 and 52-2 and the compare block 54. Thus, in accordance with the invention, the add blocks add their inputs and the compare block compares the inputs (employing the compression and carry techniques described above) at substantially the same time. The compare block instructs the select block to output the larger of the two metrics generated by the add blocks as the ACS result. With this arrangement, the comparison operation is performed substantially concurrently with addition, and the select signals are available approximately during the same time the path metrics are available.

Figure 6:
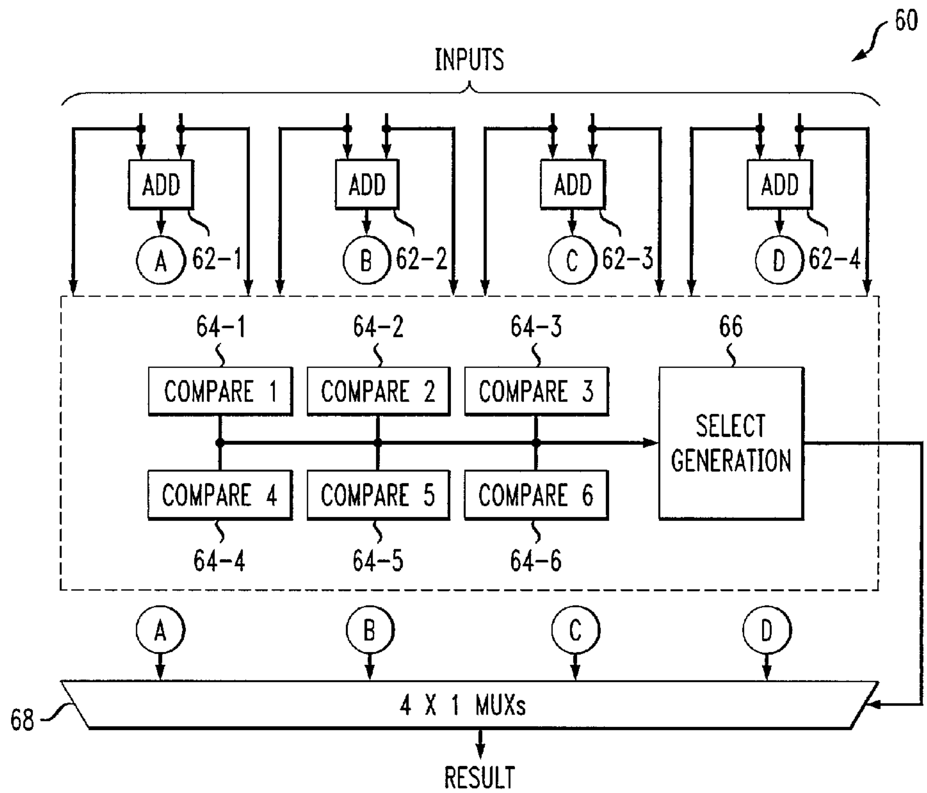
FIG. 6 is a block diagram generally illustrating a 4-way ACS module according to an embodiment of the present invention.

FIG. 6 is a block diagram generally illustrating a 4-way ACS module according to an embodiment of the present invention. As illustrated in FIG. 6, the ACS module 60 comprises four add blocks 62-1 through 62-4, six parallel compare blocks 64-1 through 64-6, a select generation block 66, and a 4×1 multiplexer (MUX) 68. Again, as is evident, in comparison to the 4-way ACS module illustrated and described above in the context of FIG. 3, the inputs to the inventive ACS module of FIG. 6 are provided to both the add blocks 62-1 through 62-4 and the compare blocks 64-1 through 64-6. Thus, in accordance with the invention, the add blocks generate the path metrics and the compare blocks perform comparisons of all possible combinations of the path metrics (employing the compression and carry techniques described above), at substantially the same time. Select generator 66 integrates the outputs of the comparators to form the appropriate selection signal, i.e., the signal that indicates which of the generated path metrics is largest. A logical AND of comparator conditions of the different path metric pairs enables the formation of the MUX selection signal. The MUX 68 then outputs the largest path metric in response to the selection signal. For example, if the individual comparators indicate that one potential path metric is greater than or equal to all others, then this is the largest path metric.

The use of six parallel compare blocks (64-1 through 64-6) is based on the following rationale. Assume we have a pair-wise comparison of four sums, say, p, q, r and s. The possible pair-wise comparison conditions are p>q, p>r, p>s, q>r, q>s and r>s. Hence, the reason for having six comparators is because there are six combinations possible. This translates into six levels of 4:2 compressors followed by six carry evaluation logic blocks. All six comparators work in parallel.

In Viterbi decoders, while the evaluation of path metrics and state identification signals are essential for the functioning of the algorithm, there is no requirement that the path metrics need be remembered all the time. The life times of path metrics are, at most, one cycle. Once the next state is identified and the present path metric is stored, there is no need to remember any of the previous path metrics.

Thus, in accordance with the present invention, it is not mandatory that carry propagate additions for the computation of potential path metrics be performed. Advantageously, the required comparator conditions can be evaluated even if the path metrics are represented in carry save form. In this case, the number of path metric components to be compressed together for the evaluation of comparator conditions double, however, there is no need to fully evaluate all the path metrics. This gives an added degree of freedom in design. Path metric computations through carry save addition result in power/area reductions, since there is no need to complete any of the carry propagate additions.

It is to be understood though that while path metrics themselves may preferably be saved in carry save form, they can alternatively be saved in the traditional form, i.e., carry propagate form. The comparators can accept the state metrics in either form.

Figure 7A:
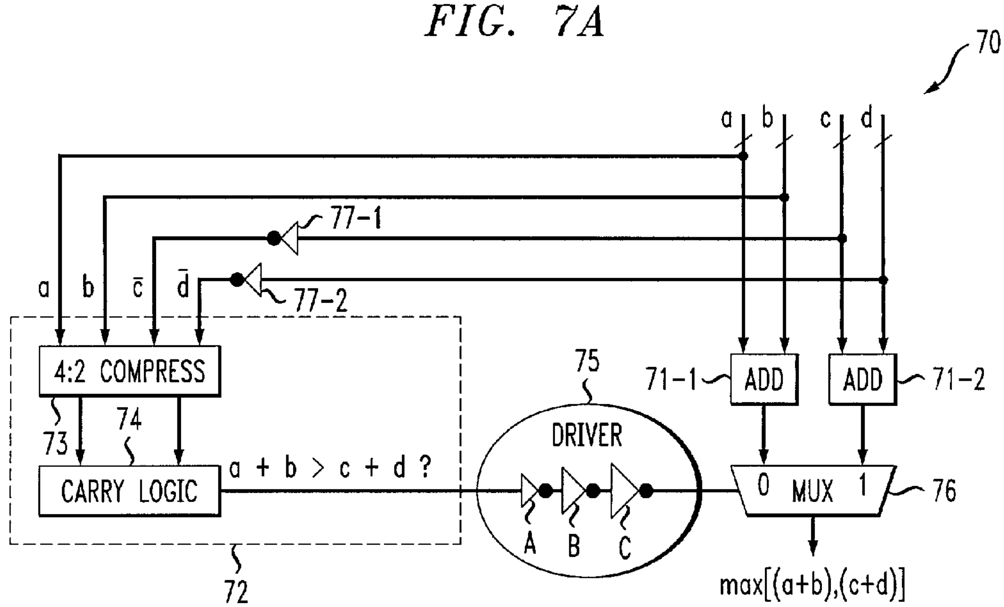
FIG. 7A is a block schematic diagram more specifically illustrating a 2-way ACS module according to an embodiment of the present invention.
Figure 7B:
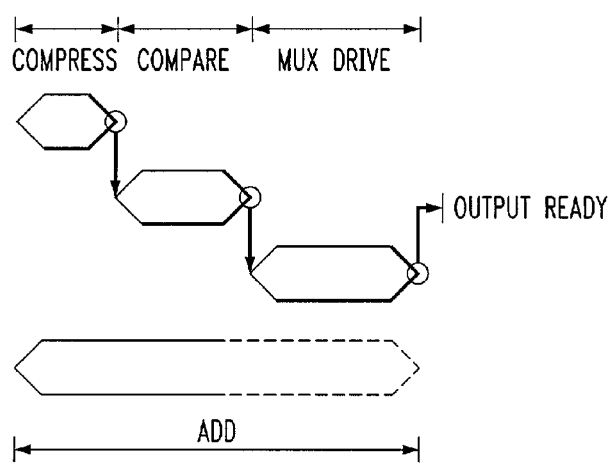
FIG. 7B is a timing diagram illustrating the cause-effect behavior of the various sub-operations of ACS according to an embodiment of the present invention.

Referring now to FIGS. 7A and 7B, more specific details of a 2-way ACS module according to an embodiment of the present invention are provided. FIG. 7A is a block schematic diagram more specifically illustrating the 2-way ACS module, while FIG. 7B is a timing diagram illustrating the cause-effect behavior of the various sub-operations of the 2-way ACS module.

As shown in FIG. 7A, the 2-way ACS module 70 comprises a first add block 71-1, a second add block 71-2, a comparator block 72 including a 4:2 compressor block 73 and carry logic 74, a driver block 75 with a three-stage buffer arrangement (denoted as inverters A, B and C), a multiplexer (MUX) 76, a first inverter 77-1, and a second inverter 77-2. Inverters 77-1 and 77-2 perform bit-wise inversion of c and d (actually, 77-1 and 77-2 represent a number of parallel inverters operating on each of the data bits of c and d). It is to be understood that the ACS module 70 is similar in operation to the ACS module 50 of FIG. 5, with the exception that FIG. 7 illustrates details of the use of the compression and carry functions (which cumulatively comprise the comparator functions, as well as driver circuitry, in accordance with 2-way ACS operations according to the invention. It is to be appreciated that the implementations of higher radix ACS modules (e.g., 4-way, ACS, etc.) are straightforward given the detailed descriptions of the invention provided herein.

More particularly, the 4:2 compressor block 73 performs carry save addition. For instance, the inputs to the comparator block are the 8 bit unsigned data a, b, $\bar{c}$, and $\bar{d}$. It is to be understood that inverters 77-1 and 77-2 respectively convert c and d to 1's complement form, denoted as $\bar{c}$ and $\bar{d}$. Thus, the inputs may be represented as shown in FIG. 4A. The 4:2 compressor block performs 4:2 compression, as illustrated and explained above in the context of FIGS. 4D and 4E, resulting in data as shown in FIG. 4C where the ss and the ts represent the compressed sum and carry bits, respectively.

The carry logic block 74 evaluates the carry output from the t7, t7' bit position (FIG. 4C) of the results of the 4:2 compressor block 73. For example, a carry out of 1 implies a±b>c±d and a carry out of 0 implies a±b≦c±d. Thus, the carry output is labeled "a+b>c+d?" indicating whether the potential path metric represented by "a+b" is greater than or less than (or equal to) the potential path metric represented by "c+d."

Due to fanout considerations, the comparator output is connected to the MUX select lines through driver circuitry. The driver block 75 is drawn generally in a three stage buffer arrangement in order to functionally represent driver circuitry. In one embodiment, there may be two driver circuits working in parallel, one distributing the true condition (e.g., a+b>c+d? Answer: YES) and the other distributing the complement condition (e.g., a+b>c+d? Answer: NO). Each driver circuit may have multiple stages (e.g., three as shown in FIG. 7A), depending on the implementation. These two signals are connected to the MUX select lines. Since these signals are mutually exclusive, only one will be active at any time.

The 2×1 MUX stage 76 routes one of its inputs, "a+b" or "c+d" (generated by add blocks 71-1 and 71-2, respectively) in accordance with the resolution of the comparison operation, i.e., the select signal(s) provided by the carry logic block 74.

Referring now to FIG. 7B, a timing relationship is shown depicting the cause-effect behavior of the various sub-operations of the 2-way ACS module 70. The arrows starting from a small circle indicate that the termination of the operation (marked by the small circle) initiates the operation pointed to by the arrow. The dotted boundaries of the polygon representing the add operation indicate a relaxed timing requirement. The add operation can complete anywhere within the interval demarcated by the dotted lines. It is to be understood that the timing diagram does not necessarily represent precise timing behavior. Rather, a general behavior assuming an ACS implementation in sub 0.2 micron technology is depicted. With a sub 0.2 micron CMOS process, the delay associated with the MUX drive operation can be even greater than that of the logic evaluation (carry evaluation) for comparison. However, this is a function of layout geometry and target technology.

With device geometry migration into 0.2 or lower feature sizes, devices are rather fast but wires are slow. Because of this, implementations that minimize fanouts and wire lengths favor high speed and low power. As can be seen, compress—compare (carry evaluation)—MUX drive operations, together, fall in the critical path. Addition is no longer in the critical path. This gives an extra freedom in design—slow, low area, low power adders (that are cheaper to implement) can perform the required additions.

Competitive analysis—sequential add—compare logic: In addition, the LSB bits of the sum are available earlier. Because of this, comparisons can begin as soon as these LSBs are available. In theory, the comparator condition can be made available within a few gate delays after the completion of addition. Now, logic designs that minimize this "few gate delays" tend to become too complex. The real complexity here can be characterized by fanouts. The worst case fanouts of designs that aggressively target minimization of this "few gate delays" escalate rapidly. As already discussed, fanout escalation brings undesirable artifacts in timing, e.g., excessive delays associated with the distribution of high fanout signals.

With the approach of the invention, the compress-compare logic can be independently optimized for the best speed. Thus, power minimization can be targeted in the adder data paths. With this inventive approach (having an extra degree of freedom in design optimization), designs are realized that are guaranteed to perform better than traditional approaches.

Analytical power/delay models that reflect the micro-architectural/arithmetic, as well as implementation complexities, of the sequential ACS techniques and the substantially concurrent ACS techniques have been developed. The following paragraphs explain these models, as well as the issues and considerations involved in their development. Before we go into the specifics of power/delay models, the following definition shall be introduced.

Definition: Co-efficient of parasitic loading—The co-efficient of parasitic loading of an interconnect is defined as:

$$k = \frac{C_L}{C_{Geff}} - 1 \ldots (k \geq 0) \tag{2}$$

where $C_L$ and $C_{Geff}$ represent the capacitive loading seen by the driver/gate that excites the interconnect and the effective gate input capacitance loading of the interconnect, respectively. $C_{Geff}$ is the sum of input capacitances of all the gates connected to the node under consideration. The parameter k captures both the technological as well as layout geometry issues. The more regular the layout is, and the better the cells are packed together (which implies shorter interconnects), the less the value of k. With technology scaling, while device feature sizes scale more aggressively than wire size, the impact of parasitic loading is more significant.

The effective capacitance that is switched by a driver is given by:

$$C_L = (1+k)C_{Geff} \tag{3}$$

The significance of parasitic loading is twofold. First of all, the higher the parasitic loading, the larger the power requirements to switch the logic status of nodes. While it is feasible that larger capacitances can be switched by using stronger drivers, there is an inevitable price for this. The delays of drivers are functions of the number of inverter stages, stage ratio and technology. With tapered CMOS drivers, the stage ratio is given by:

$$S = \exp\left[\frac{\ln((1+k)Y)}{N}\right] \tag{4}$$

In the above expression, Y and N represent the fanout and number of inverter stages that constitute the driver, respectively. With commercial IC (integrated circuit) designs, three stage drivers are popular. The power efficiencies and slew rates of drivers are intimately connected with S and N. With larger stage ratios, both these factors suffer.

With sequential ACS, the addition operation has to complete before comparisons begin. Once the comparison operation is complete, the select operation begins. In general, the fastest adders work in logarithmic time, which is true with comparators as well. The time complexity of the select operation is proportional to the delay of drivers that excite the MUX select lines, which is a function of the data size. The time complexity of radix 2 sequential ACS can be parameterized by the following:

$$D1 = NS\tau_1 + (2 + \log_2 4n^2)\tau_2 \tag{5}$$

where $\tau_1$ and $\tau_2$ represent the delays of a minimum sized inverter and 2 input gate respectively of the target technology, while n represents the width (in bits) of operands of addition. The relation between $\tau_1$ and $\tau_2$ is a function of technology, logic style, etc. Experience with state-of-the-art designs involving 0.5 micron gate libraries suggests an average of $\tau_2 \approx 1.5\tau_1$. The factor NS $\pi_1$ captures the delay of drivers that enable the MUX select signals.

The time complexity of the 2-way ACS according to the present invention is given by:

$$D2=NS\tau_1+(4+\log_2 2n)\tau_2 \quad (6)$$

With the add-compare techniques of the invention, delay reduction is one main advantage. In terms of circuit complexity, for 2-way ACS, in addition to the add-compare blocks, one level of 4:2 compressors is required, as explained above. However, with conventional ACS, since the addition falls within the critical path, the adders are always designed for the fastest operation. With the techniques of the invention, since the critical path is rather the comparator and select path, the adders can be simpler. Because of this, the extra power implications of the 4:2 compressor logic is offset by the simplification of adders. The relative power implications of the ACS techniques of the invention can be modeled by:

$$P_2(1+c\mathbf{1})P_1 \quad (7)$$

where $P_2$ and $P_1$ represent the power consumptions of conventional approach and the inventive approach, respectively. The parameter c1 captures the incremental implementation complexity measure (relative) of the inventive approach.

The time complexity of conventional and inventive 4-way ACS techniques are given by:

$$D3=NS\tau_1+(4+\log_2 4n^2)\tau_2, \text{ and} \quad (8)$$

$$D4=NS\tau_1+(6+\log_2 2n)\tau_2, \quad (9)$$

respectively. Similarly, the relative power equations are given by:

$$P_4=(1+c\mathbf{2})P_3 \quad (10)$$

where $P_3$ and $P_4$ represent the power consumptions of conventional approach and the inventive approach, respectively. The parameter c2 reflects the incremental implementation complexity measure (relative) of the inventive 4-way ACS approach. The power delay measures of conventional and inventive radix 2 approaches are given by:

$$P_{D1}=[NS\tau_1+(2+\log_2 4n^2)\tau_2]P_1, \text{ and} \quad (11)$$

$$P_{D2}=[NS\tau_1+(4+\log_2 2n)\tau_2](1+c\mathbf{1})P_1, \quad (12)$$

respectively. The following equations capture the relative power delay implications of the conventional and inventive radix 4 approaches:

$$P_{D3}=[NS\tau_1+(4+\log_2 4n^2)\tau_2]P_3, \text{ and} \quad (13)$$

$$P_{D4}=[NS\tau_1+(6+\log_2 2n)\tau_2](1+c\mathbf{2})P_3, \quad (14)$$

respectively.

Figure 8:
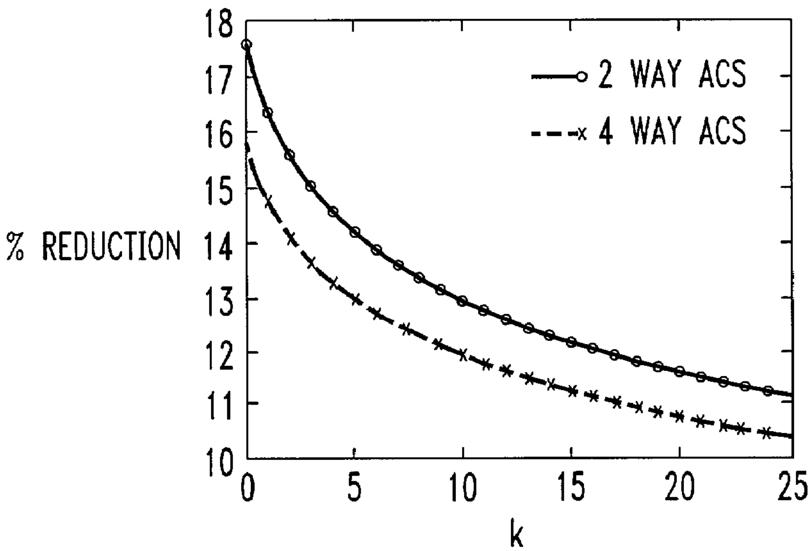
FIG. 8 is a graph illustrating estimated delay reduction realized in accordance with the present invention.

FIG. 8 illustrates the co-efficient of parasitic loading versus estimated delay reduction realized by the ACS techniques of the present invention in comparison with conventional ACS techniques. It is to be appreciated that the delay estimates used in the analysis depicted in FIG. 8 come from the logic model of the multiplexor-based 4:2 compressor shown and described above in the context of FIG. 4D.

During the analysis, it was further assumed that optimally designed 3-stage buffers drive the select lines of MUXs. Experience with 0.5 micron CMOS processes suggest a co-efficient of parasitic loading of the order of 7 for 2 input 16 bit MUXs. For this case, the delay advantages of the inventive radix 2 and 4 techniques are better than about 13.5% and 12.4%, respectively. With device feature size shrinking, the co-efficient of parasitic loading will increase. Anticipating a co-efficient of parasitic loading of around 20 for future sub 0.2 micron processes, the worst case delay advantage is still better than 10%.

Power delay comparisons of the conventional ACS approach and the inventive ACS approach suggest that the power delay of the inventive approach is less than that of the conventional approach under worst case assumptions that c1=c2=0.1. Acknowledging the fact that in a typical implementation, adders, comparators and selection MUXs consume most of the power, such a worst case assumption is well justified.

As is evident from the results provided above, the ACS techniques of the present invention are advantageous as far as speed performance enhancement of Viterbi decoders is concerned. While the delay reduction for 16 bit ACSs is advantageous, the delay reduction with wider path metrics is even better. With wider metrics, the halving of the time complexity of add-compare operations results in higher throughput enhancements.

Figure 9:
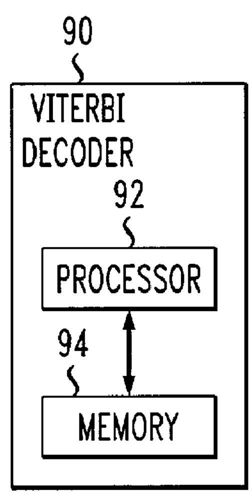
FIG. 9 is a block diagram illustrating an embodiment of a Viterbi decoder for use in accordance with the present invention.

Referring now to FIG. 9, a block diagram illustrates an embodiment of a Viterbi decoder for use in accordance with the present invention. As is known, a Viterbi decoder is typically one functional processing block in a receiver portion of a transceiver configured for use in a communications system, such as a mobile digital cellular telephone. The Viterbi decoder typically performs error correction functions. As shown in FIG. 9, a Viterbi decoder 90 comprises a processor 92 and associated memory 94. It is to be understood that the functional elements of an ACS module of the invention, as described above in detail and which make up a part of a Viterbi decoder, may be implemented in accordance with the decoder embodiment shown in FIG. 9.

The processor 92 and memory 94 may preferably be part of a digital signal processor (DSP) used to implement the Viterbi decoder. However, it is to be understood that the term “processor” as used herein is generally intended to include one or more processing devices and/or other processing circuitry (e.g., application-specific integrated circuits or ASICs, etc.). The term “memory” as used herein is generally intended to include memory associated with the one or more processing devices and/or circuitry, such as, for example, RAM, ROM, a fixed and removable memory devices, etc. Also, in another embodiment, the ACS module may be implemented in accordance with a coprocessor associated with the DSP used to implement the overall Viterbi decoder. In such case, the ACS coprocessor could share in use of the memory associated with the DSP.

Accordingly, software components including instructions or code for performing the methodologies of the invention, as described herein, may be stored in the associated memory of the Viterbi decoder and, when ready to be utilized, loaded in part or in whole and executed by one or more of the processing devices and/or circuitry of the Viterbi decoder.

Typically, in DSPs, the conventional add-compare-select operation targeting Viterbi decoding is spread into more than one instruction. First, add operations evaluate potential path metrics. Next, pair-wise comparison (and even selection of largest) complete/enable the compare-select part of ACS. With this approach, the obvious disadvantages are:

(1) Larger number of cycles than is possible with a fast compound ACS.

(2) Power consumption: The potential path metrics after the add operation are written into registers, and these values are subsequently read back by the following compare (or compare-select) instruction. Register read/writes are expensive, in terms of power consumption. Instruction decoding power is an intimately related issue. Two instructions decoded in two cycles consume more power, in contrast to that of a compound instruction decoded in one cycle.

(3) Register pressure: Storage of intermediate values after the add operation demands register space. With limited register resources, this adds restrictions. For example, the non-availability of registers is a potential restriction in VLIW (very long instruction word) machines. During certain cycles, even if there exist free functional units, waiting instructions bound for those units can not be scheduled if sufficient register resources do not exist. The net effect is a reduction in IPC (instructions per cycle) count. Restrictions due to register pressure are applicable to superscalar and vector machines also.

In the above, the reason for the handling of ACS as add followed by compare (or compare-select) is primarily speed. If the add-compare-select operation can not be completed within one cycle, the only other option is to spread it into two cycles. With conventional approaches, even if the delay of an ACS functional unit is slightly more than the interval of one processor cycle, the ACS operation has to be split into more than one cycle (instead of operating the processor at a lower clock). That means, even small delay reduction attainable through the inventive approach helps the handling of ACS in one cycle. The handling of ACS in one cycle has other incentives too, power reduction and IPC enhancement, as discussed above. In summary, fast ACS operations provided in accordance with the present invention make ACS units embodying such techniques an attractive choice for DSPs, microprocessors and ASICs.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method of performing add-compare-select operations in accordance with a Viterbi decoder, the method comprising the steps of:

respectively adding input values of two or more sets of input values to generate sums for the two or more sets;

substantially concurrent with the respective addition of the input values of the two or more sets of input values, comparing the two or more sets of input values, wherein the comparison operation comprises performing carry save addition on the two sets of input values, and evaluating a carry output of the carry save addition operation to make the determination as to which set of the two or more sets would yield a particular result; and selecting one of the generated sums of the two or more input sets based on the comparison operation performed on the two or more sets of input values.

2. The method of claim 1, wherein the comparison operation further comprises comparing the two or more sets of input values to make a determination as to which set of the two or more sets would result in the largest sum.

3. The method of claim 1, wherein the carry save addition operation is performed by one or more data compressors.

4. The method of claim 1, wherein one input value of each set of input values is a previously computed path metric and the other input value of each set of input values is an appropriate branch metric such that the generated sum of the input values represents a new path metric which may potentially be selected based on the substantially concurrent comparison operation.

5. The method of claim 1, wherein the comparison operation begins when the input values of the two or more sets are available such that the comparison operation is completed before completion of the addition operation.

6. Apparatus for performing add-compare-select operations in accordance with a Viterbi decoder, the apparatus comprising:

at least one processor operative to: (i) respectively add input values of two or more sets of input values to generate sums for the two or more sets; (ii) substantially concurrent with the respective addition of the input values of the two or more sets of input values, compare the two or more sets of input values, wherein the comparison operation comprises performing carry save addition on the two sets of input values, and evaluating a carry output of the carry save addition operation to make the determination as to which set of the two or more sets would yield a particular result; and (iii) select one of the generated sums of the two or more input sets based on the comparison operation performed on the two or more sets of input values; and a memory, coupled to the at least one processor, for storing at least a portion of results associated with one or more of the add, compare, select operations.

7. The apparatus of claim 6, wherein the comparison operation further comprises comparing the two or more sets of input values to make a determination as to which set of the two or more sets would result in the largest sum.

8. The apparatus of claim 6, wherein one input value of each set of input values is a previously computed path metric and the other input value of each set of input values is an appropriate branch metric such that the generated sum of the input values represents a new path metric which may potentially be selected based on the substantially concurrent comparison operation.

9. The apparatus of claim 6, wherein the comparison operation begins when the input values of the two or more sets are available such that the comparison operation is completed before completion of the addition operation.

10. A Viterbi decoder for performing an add-compare-select algorithm, the algorithm comprising the steps of:

respectively adding input values of two or more sets of input values to generate sums for the two or more sets;

substantially concurrent with the respective addition of the input values of the two or more sets of input values, comparing the two or more sets of input values, wherein the comparison operation comprises performing carry save addition on the two sets of input values, and evaluating a carry output of the carry save addition operation to make the determination as to which set of the two or more sets would yield a particular result; and selecting one of the generated sums of the two or more input sets based on the comparison operation performed on the two or more sets of input values.

11. The Viterbi decoder of claim 10, wherein the comparison operation further comprises comparing the two or more sets of input values to make a determination as to which set of the two or more sets would result in the largest sum.

12. The Viterbi decoder of claim 10, wherein the Viterbi decoder comprises an integrated circuit device.

13. An article of manufacture for performing add-compare-select operations in accordance with a Viterbi decoder, the article comprising a machine readable medium containing one or more programs which when executed implement the steps of:

respectively adding input values of two or more sets of input values to generate sums for the two or more sets;

substantially concurrent with the respective addition of the input values of the two or more sets of input values, comparing the two or more sets of input values, wherein the comparison operation comprises performing carry save addition on the two sets of input values, and evaluating a carry output of the carry save addition operation to make the determination as to which set of the two or more sets would yield a particular result; and selecting one of the generated sums of the two or more input sets based on the comparison operation performed on the two or more sets of input values.

14. The article of claim 13, wherein the comparison operation further comprises comparing the two or more sets of input values to make a determination as to which set of the two or more sets would result in the largest sum.

15. An integrated circuit device, the integrated circuit device comprising a Viterbi decoder operable to:

respectively add input values of two or more sets of input values to generate sums for the two or more sets;

substantially concurrent with the respective addition of the input values of the two or more sets of input values, compare the two or more sets of input values, wherein the comparison operation comprises performing carry save addition on the two sets of input values, and evaluating a carry output of the carry save addition operation to make the determination as to which set of the two or more sets would yield a particular result; and select one of the generated sums of the two or more input sets based on the comparison operation performed on the two or more sets of input values.

16. The integrated circuit device of claim 15, wherein the comparison operation further comprises comparing the two or more sets of input values to make a determination as to which set of the two or more sets would result in the largest sum.

* * * * *